US012641801B2

(12) United States Patent
Chicot et al.

(10) Patent No.: US 12,641,801 B2
(45) Date of Patent: May 26, 2026

(54) CAPACITOR COMPRISING A STACK OF LAYERS MADE OF A SEMICONDUCTOR MATERIAL HAVING A WIDE BANDGAP

(71) Applicants: Diamfab, Grenoble Cedex (FR); Centre National De La Recherche Scientifique, Paris (FR); Institut Polytechnique de Grenoble, Grenoble (FR); Universite Grenoble Alpes, Saint Martin d-Heres (FR)

(72) Inventors: Gauthier Chicot, Fontaine (FR); Khaled Driche, Fontaine (FR); David Eon, Grenoble (FR); Etienne Gheeraert, Coublevie (FR); Cédric Masante, Fontaine (FR); Julien Pernot, Grenoble (FR)

(73) Assignees: Diamfab, Grenoble Cedex (FR); Centre National De La Recherche Scientifique, Paris (FR); Institut Polytechnique de Grenoble, Grenoble (FR); Universite Grenoble Alpes, Saint Martin d-Heres (FR)

( * ) Notice: Subject to any disclaimer, the term of this patent is extended or adjusted under 35 U.S.C. 154(b) by 476 days.

(21) Appl. No.: 18/549,016

(22) PCT Filed: Mar. 3, 2022

(86) PCT No.: PCT/FR2022/050383
§ 371 (c)(1),
(2) Date: Sep. 5, 2023

(87) PCT Pub. No.: WO2022/185014
PCT Pub. Date: Sep. 9, 2022

(65) Prior Publication Data
US 2024/0154045 A1 May 9, 2024

(30) Foreign Application Priority Data
Mar. 5, 2021 (FR) ...................................... 2102170

(51) Int. Cl.
*H10D 62/80* (2025.01)
*H10D 1/62* (2025.01)
(Continued)

(52) U.S. Cl.
CPC ............... *H10D 1/62* (2025.01); *H10D 62/80* (2025.01); *H10D 62/8303* (2025.01); *H10D 62/8325* (2025.01); *H10D 62/8503* (2025.01)

(58) Field of Classification Search
CPC .... H01G 4/1272; H01G 4/1281; H10D 1/665; H10D 1/66; H10D 1/64; H10D 1/62
See application file for complete search history.

(56) References Cited

U.S. PATENT DOCUMENTS 3,798,508 A * 3/1974 Kohashi ................... H10D 1/64
257/312
5,060,110 A * 10/1991 Kane .................... H10D 62/834
257/E29.345
(Continued)

FOREIGN PATENT DOCUMENTS

TW          I320571          2/2010

OTHER PUBLICATIONS

"Deep hole traps in boron-doped diamond" in Physical Review B 81, 235205 (2010) by Pierre Muret et al. p. 235205-3 (Year: 2010).*
(Continued)

*Primary Examiner* — Eric A. Ward
(74) *Attorney, Agent, or Firm* — TraskBritt

(57) ABSTRACT
A capacitor comprises a stack of layers made of a semiconductor material having a band gap energy greater than 2.3 eV, the stack of layers comprising: an electrically insulating
(Continued)

intermediate layer having a resistivity greater than 10 kohm·cm and comprising n- or p-type deep dopants producing energy levels more than 0.4 eV from the conduction band or the valence band of the semiconductor material, two contact layers having a resistivity less than or equal to 10 kohm·cm and comprising dopants of a type opposite to that of the deep dopants of the intermediate layer, the two contact layers being arranged on either side of the intermediate layer to form two pn junctions.

19 Claims, 2 Drawing Sheets

(51) Int. Cl.

| | |
|---|---|
| *H10D 62/83* | (2025.01) |
| *H10D 62/832* | (2025.01) |
| *H10D 62/85* | (2025.01) |

(56) References Cited

U.S. PATENT DOCUMENTS

| | | | | |
|---|---|---|---|---|
| 5,789,801 A * | 8/1998 | Stoneham | ............... | H10D 1/64 |
| | | | | 257/598 |
| 6,930,009 B1 * | 8/2005 | Quick | ................... | H10P 34/42 |
| | | | | 438/335 |
| 9,685,908 B1 * | 6/2017 | Lee | ...................... | H03B 5/1253 |
| 2006/0007727 A1 | 1/2006 | Harrison et al. | | |
| 2008/0190355 A1 | 8/2008 | Chen et al. | | |
| 2010/0264426 A1 * | 10/2010 | Blair | ................... | H10D 1/042 |
| | | | | 257/E21.042 |
| 2015/0187865 A1 | 7/2015 | Barabash et al. | | |
| 2020/0051969 A1 * | 2/2020 | Willemen | ............... | H10D 8/00 |

OTHER PUBLICATIONS

Taiwanese Office Action and Search Report for Application No. 111108009 dated May 20, 2025, 6 pages with English translation.

Aleksov et al., Diamond Diodes and Transistors, Institute of Physics Publishing, Semiconductor Science Technology, vol. 18, (2003), pp. S59-S66.

Korean Office Action for Application No. 10-2023-7030118 dated Sep. 25, 2025, 13 pages with English translation.

Goss et al., Donor and Acceptor States in Diamond, Diamond and Related materials, vol. 13, (2004), pp. 684-690.

International Search Report for International Application No. PCT/FR2022/050383 dated Jun. 1, 2022, 3 pages.

International Written Opinion for International Application No. PCT/FR2022/050383 dated Jun. 1, 2022, 6 pages.

Inushima et al., Electrical measurements on p+−p−p+ homoepitaxial diamond capacitors, Applied Physics Letters, vol. 77, No. 8, (Aug. 21, 2000), pp. 1173-1175.

* cited by examiner

CAPACITOR COMPRISING A STACK OF LAYERS MADE OF A SEMICONDUCTOR MATERIAL HAVING A WIDE BANDGAP

CROSS-REFERENCE TO RELATED APPLICATIONS

This application is a national phase entry under 35 U.S.C. § 371 of International Patent Application PCT/FR2022/050383, filed Mar. 3, 2022, designating the United States of America and published as International Patent Publication WO 2022/185014 A1 on Sep. 9, 2022, which claims the benefit under Article 8 of the Patent Cooperation Treaty to French Patent Application Serial No. FR2102170, filed Mar. 5, 2021.

TECHNICAL FIELD

The present disclosure relates to the field of microelectronic devices. It relates, in particular, to a capacitor comprising a stack of layers made of a wide-bandgap semiconductor material.

BACKGROUND

The interest in semiconductors with a wide bandgap, such as silicon carbide, gallium nitride or diamond, has considerably increased over recent years since power devices and integrated power supply systems based on these materials can manage a much higher power density compared to their traditional silicon homologs, and this with lower active area dimensions. They are increasingly widely used in the manufacture of devices operating at high voltages and high frequencies, to meet the needs of rising fields of electronics, such as, in particular, hybrid or electric vehicles.

Beyond active power devices, a microelectronic circuit also requires passive components, such as capacitors, supporting very high voltages (for example, greater than 1000 V, or even greater than 3000 V), to form RC dampers capable of eliminating voltage transients while switching between a closed circuit and an open circuit; this avoids overload damage to the active devices.

The ceramic insulator capacitors are known to withstand very high voltages. However, they have several drawbacks: first, their large size prevents them from being integrated as close as possible to active devices; the significant distance between active and passive devices creates parasitic inductances, this becoming all the more true as the switching frequencies increase. In addition, these capacitors are not compatible with integration during microelectronic manufacturing of active devices, in a clean room. Finally, they operate in a limited temperature range, typically between room temperature and 125° C.

BRIEF SUMMARY

The present disclosure aims to remedy all or some of the aforementioned drawbacks. It proposes a capacitor with a fixed capacitance comprising a stack of layers made of a wide-bandgap semiconductor, able to withstand very high voltages, reliable, the capacitance value of which is constant whatever the applied voltage, having reduced dimensions and capable of operating in a wide range of temperatures, typically up to 300° C. The capacitor according to the disclosure is also compatible with the microelectronic manufacturing methods and can therefore be co-integrated monolithically near active power devices.

The disclosure relates to a capacitor comprising a stack of layers of a semiconductor material having a bandgap energy greater than 2.3 eV, the stack of layers comprising:

an electrically insulating intermediate layer having a resistivity greater than 10 kohm·cm and comprising n- or p-type deep dopants producing energy levels located at over 0.4 eV from the conduction band or the valence band of the semiconductor material, two contact layers having a resistivity less than 10 kohm·cm and comprising dopants of the opposite type than that of the deep dopants of the intermediate layer, the two contact layers, electrically isolated from each other, being arranged on either side of the intermediate layer to form two pn-junctions.

According to other advantageous and non-limiting features of the disclosure, either individually or in any technically feasible combination:

the two contact layers have a resistivity greater than 1 mohm·cm, the capacitor then defining a capacitance with an integrated resistor to form an RC damper;

the two contact layers have a resistivity less than or equal to 1 mohm·cm, to impart a purely capacitive character to the capacitor;

the capacitor comprises two metal electrodes respectively electrically connected to the two contact layers;

the deep dopants are present in the intermediate layer at a concentration between $1 \times 10^{14}/cm^3$ and $1 \times 10^{21}/cm^3$;

the intermediate layer has a thickness of between 1 nm and 2 mm, preferably between 500 nm and 50 µm;

each contact layer has a thickness of between 5 nm and 50 µm, preferably between 50 nm and 1 µm;

the semiconductor material of the stack of layers is chosen from silicon carbide (SiC), gallium nitride (GaN), aluminum nitride (AlN), ternary or quaternary alloys based on nitride, boron nitride (BN), gallium oxide ($Ga_2O_3$) and diamond;

the capacitor comprises a support substrate on which the stack of layers is arranged;

the support substrate is composed of a semiconductor material of the same kind as the semiconductor material of the stack of layers;

the semiconductor material forming the stack of layers is diamond, the deep dopants of the intermediate layer are n-type, and the dopants of the contact layers are p-type and are boron atoms;

the deep dopants of the intermediate layer are nitrogen atoms; and the semiconductor material forming the stack of layers is silicon carbide, the deep dopants of the intermediate layer are p-type and are vanadium atoms, and the dopants (shallow dopants) of the contact layers are n-type and are nitrogen atoms.

BRIEF DESCRIPTION OF THE DRAWINGS

Other features and advantages of the disclosure will emerge from the following detailed description of example embodiments of the disclosure with reference to the accompanying figures, wherein.

Figure 1A:
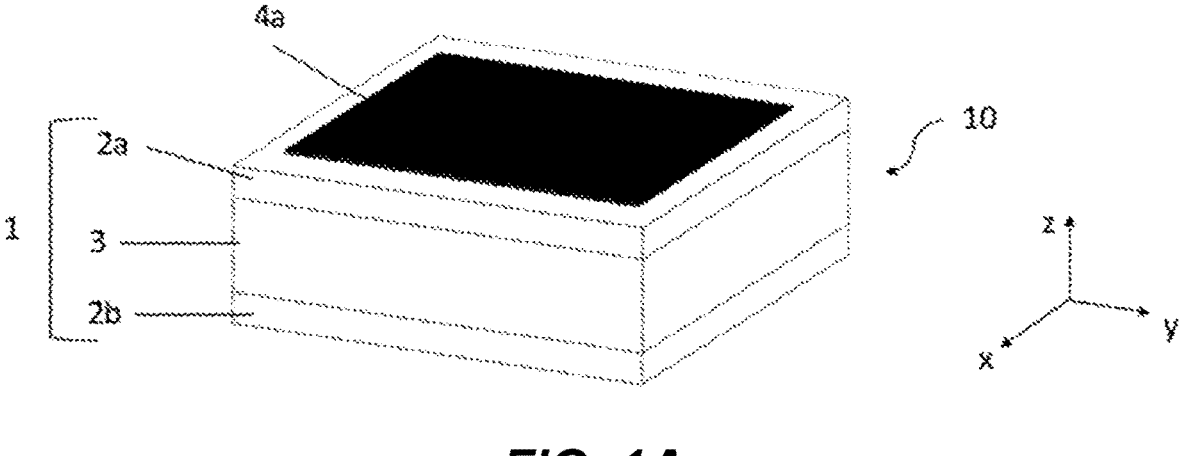
FIGS. 1A and 1B show a first embodiment of a capacitor according to the present disclosure.

The same references in the figures may be used for elements of the same type. The figures are schematic depictions, which, for the sake of readability, are not to scale. In particular, the thicknesses of the layers along the z axis are not to scale with respect to the lateral dimensions along the x and y axes; and the relative thicknesses of the layers between them are not necessarily respected in the figures.

DETAILED DESCRIPTION

The present disclosure relates to a capacitor 10 comprising a stack of layers 1 formed of a semiconductor material called a wide bandgap material, that is to say, having a bandgap energy, between the valence band and the conduction band, greater than 2.3 eV. The semiconductor material may, in particular, be chosen from:

silicon carbide (SiC), for example, 4H—SiC, whose bandgap energy is 3.26 eV, gallium nitride (GaN), whose bandgap energy is 3.4 eV, aluminum nitride (AlN), with a bandgap energy of 6.2 eV, boron nitride (BN), whose bandgap energy is about 5.9 eV, ternary or quaternary alloys based on nitride, for example, AlGaN, InGaN, etc., gallium oxide ($Ga_2O_3$), with a bandgap energy of 4.8 eV, and diamond, whose bandgap energy is 5.45 eV.

The stack of layers 1 of the capacitor 10 comprises three layers 2a, 2b, 3 formed in the wide-bandgap semiconductor material: an intermediate layer 3 arranged between two contact layers 2a, 2b (FIGS. 1A, 1B and 2A, 2B).

The contact layers 2a, 2b have a resistivity less than 10 kohm·cm. Depending on various aspects of the disclosure, they may have a resistivity less than or equal to 10 ohm·cm, less than or equal to 1 ohm·cm, less than or equal to 10 mohm·cm, or less than or equal to 1 mohm·cm. The contact layers 2a, 2b are doped with n-type (donor) or p-type (acceptors) dopants capable of increasing the conductivity of the semiconductor material, to adjust the expected resistivity. They are electrically isolated from each other because they are intended to form (wholly or partially) the two metal armatures of the capacitor 10.

As is well known per se, the donors and the acceptors are impurities (atoms) introduced, intentionally or not, in a semiconductor; the donors (n-type) are capable of giving electrons to the conduction band or to other levels in the bandgap, and the acceptors (p-type) are capable of capturing electrons of the valence band or from other levels of the bandgap.

In general, shallow donors are defined as capable of easily giving an electron to the conduction band of the semiconductor. This is related to the fact that their energy level in the bandgap is slightly distant from the conduction band. A highly doped semiconductor with shallow donors therefore has electrical conductor properties, at room temperature, due to the free electrons transferred to the conduction band by the donors. Analogously, the shallow acceptors are defined as capable of easily capturing a valence-band electron of the semiconductor, because their energy level in the bandgap is slightly far from the valence band. A semiconductor heavily doped with shallow acceptors therefore has electrical conductor properties, at room temperature, due to the free holes generated in the valence band by the acceptors.

To achieve the expected resistivity ranges of the contact layers 2a, 2b, between 10 kohm·cm and less than 1 mohm·cm, the dopants introduced into the layers 2a, 2b will generally be described as shallow dopants. However, certain dopants, which are not ordinarily considered to be shallow, may be used to achieve the resistivities mentioned above. In diamond, for example, the ionization energy of the boron dopant is 0.38 eV for low dopant concentrations and tends to 0 eV when the concentration increases until it reaches the insulator-metal transition for a doping of $5 \times 10^{20}/cm^3$. It is then possible to achieve resistivities of less than 5 mohm·cm in diamond heavily doped with boron.

The conduction by hopping also makes it possible to achieve low resistivities using dopants, such as, for example, boron (acceptor) or phosphorus (donor) in diamond. To take advantage of this phenomenon, the boron concentration must be between $1 \times 10^{19}/cm^3$ and $5 \times 10^{20}/cm^3$ and that of phosphorus is greater than $1 \times 10^{19}/cm^3$.

The semiconductor material of the contact layers 2a, 2b may have a polycrystalline structure, or preferably monocrystalline structure, to reduce leaks (parasitic) and provide a better interface with the intermediate layer 3 when it itself is monocrystalline.

The intermediate layer 3 is electrically insulating, that is to say it has a resistivity greater than 10 kohm·cm.

Advantageously, the resistivity of the intermediate layer 3 is as high as possible, for example, greater than 1000 kohm·cm. It comprises deep dopants that are defined here as producing energy levels located at more than 0.4 eV of the conduction band or the valence band of the semiconductor material. The deep dopants of the intermediate layer 3 may be deep donors (n-type) or deep acceptors (p-type), specific to the nature of the semiconductor material.

Deep dopants are donors or acceptors having higher binding energies for electrons and holes, respectively, and are therefore not substantially ionized at room temperature. Compared to the shallow donors and acceptors, the energy levels of the deep donors and acceptors are positioned more deeply in the bandgap, that is to say farther from the conduction band and the valence band, respectively. The insulating character of the intermediate layer 3 can therefore be perfectly preserved in the presence of these deep dopants.

Preferably, for an operation of the capacitor 10 beyond 150° C., deep dopants producing energy levels located more than 1 eV from the valence bands (acceptors) or conduction bands (donors) will be chosen. For example, in the case of diamond, for a deep dopant concentration on the order of $1 \times 10^{16}/cm^3$, it will be advisable for the ionization energy of the deep dopant to be greater than 1 eV or to 1.3 eV, in order to ensure a resistivity of the intermediate layer 3 greater than or equal to 1000 kohm·cm, respectively for an operation at 150° C. or at 250° C.

In general, deep dopants are present in the intermediate layer 3, at a concentration between $1 \times 10^{14}/cm^3$ and $1 \times 10^{21}/cm^3$. It will be noted however that this concentration range is likely to be more restricted, typically between $1 \times 10^{14}/cm^3$ and $1 \times 10^{18}/cm^3$, in certain specific cases of deep dopants; in fact, beyond a certain concentration, certain deep dopants (such as phosphorus in diamond, already mentioned above) can participate in the electrical conduction by a phenomenon of conduction by hopping, which is not desired in the intermediate layer 3.

The semiconductor material of the intermediate layer 3 may have a polycrystalline structure, or preferably monocrystalline to guarantee good electrical insulation by avoiding leakage currents and premature breakdown, which could be promoted by the presence of grain boundaries.

In the stack of layer 1 of the capacitor 10 according to the disclosure, the dopants of the contact layers 2a, 2b are of the opposite type to that of the deep dopants of the intermediate layer 3. As the two contact layers 2a, 2b are arranged on either side of the intermediate layer 3, the stack of layers 1 thus forms two pn-junctions, respectively between the upper contact layer 2a and the intermediate layer 3, and between the lower contact layer 2b and the intermediate layer 3.

The capacitor 10 thus successively comprises the upper contact layer 2a, a pn-junction, the insulating intermediate layer 3, a pn-junction, and the lower contact layer 2b. The pn-junctions prevent the injection of carriers from the contact layers 2a, 2b into the intermediate layer 3, when a high voltage is applied to the capacitor 10, via the contact layers 2a, 2b. Such an injection would strongly degrade the insulating character of the intermediate layer 3. The pn-junctions that are established between the contact layers 2a, 2b and the intermediate layer 3 confer great stability and excellent reliability to the capacitor 10 according to the present disclosure. The capacitor effect is provided by the non-depleted zone of the intermediate layer 3, when the dopants of the intermediate layer 3 are sufficiently deep to ensure electrical insulation at the working temperature, and by the two space-charge zones of the two pn-junctions. For high working temperatures (typically above 150° C.), an overlap of the two space-charge zones of the two pn-junctions can be used to reinforce the electrical insulation of the intermediate layer 3.

The capacitor 10 according to the present disclosure takes advantage of the presence of deep dopants in the intermediate layer 3, of the type opposite the shallow dopants of the contact layers 2a, 2b, on the one hand, to ensure insulating character of the intermediate layer 3 (property of the deep impurities), and, on the other hand, to establish two pn-junctions (deep impurities used as dopants), which provide a fixed capacitance value and give electrical insulation, stability and reliability to the capacitor 10.

The intermediate layer 3 may have a thickness (along the z-axis in the figures) of between 10 nm and 2 mm, preferably between 500 nm and 50 μm. Each contact layer 2a, 2b may have a thickness of between 5 nm and 50 μm, preferentially between 50 nm and 1 μm.

According to a first example of a capacitor 10 according to the present disclosure, the semiconductor material forming the stack of layers 1 is diamond. The deep dopants of the intermediate layer 3 are n-type (donors). They may be phosphorus atoms (P) or preferably nitrogen atoms (N). In diamond, phosphorus and nitrogen produce deep levels in the bandgap, respectively at 0.57 eV and 1.7 eV below the conduction band.

By way of example, the concentration of deep nitrogen donors is on the order of $3\times10^{19}/cm^3$, and the intermediate layer 3 has a resistivity greater than 1000 kohm·cm; alternatively the concentration of deep phosphorus donors is on the order of $1\times10^{15}/cm^3$, and the resistivity of the intermediate layer 3 is greater than 100 kohm·cm.

The dopants of the contact layers 2a, 2b are boron (B), p-type (acceptors) atoms. In diamond, the boron produces a level in the bandgap, at 0.38 eV above the valence band. However, as mentioned above, the ionization energy of the boron decreases when the dopant concentration increases.

By way of example, with a concentration of acceptors on the order of $5\times10^{20}/cm^3$, the contact layers 2a, 2b have a resistivity less than 5 mohm·cm. Still by way of example, with a concentration of acceptors on the order of $5\times10^{14}/cm^3$, the contact layers 2a, 2b have a resistivity of order 1 kohm·cm.

In this first example, the stack 1 of the three layers 2a, 3, 2b defines a p/n/p-type stack.

According to a second example of a capacitor 10 according to the present disclosure, the semiconductor material forming the stack of layers is silicon carbide (SiC). The deep dopants of the intermediate layer 3 are vanadium (V) atoms, p-type. In SiC, vanadium produces a deep level in the bandgap, at 0.8 eV below the conduction band.

By way of example, the concentration of deep acceptors is on the order of $1\times10^{15}/cm^3$, and the intermediate layer 3 has a resistivity greater than 100 kohm·cm.

The shallow dopants of the contact layers 2a, 2b are nitrogen atoms, n-type. In SiC, the nitrogen produces a shallow level in the bandgap, at 0.08 eV below the conduction band. By way of example, with a concentration of donors on the order of $1\times10^{19}/cm^3$, the contact layers 3 have a resistivity less than 20 mohm·cm.

In this second example, the stack 1 of the three layers 2a, 3, 2b defines a stack of types n/p/n.

Of course, these two examples are not exhaustive, and other wide-bandgap semiconductor materials can be implemented in the capacitor 10 of the present disclosure. A stack of p/n/p or n/p/n types will be used according to the nature of the semiconductor material, in particular, as a function of the type of deep dopants and of the shallow dopants of the material. In order to be connected to a circuit or to another microelectronic component, the capacitor 10 advantageously comprises two metal electrodes 4a, 4b respectively electrically connected to the two contact layers 2a, 2b. These electrodes 4a, 4b are in ohmic contact with the layers 2a, 2b and will allow the electrical connection of the capacitor 10 to the outside. Each electrode 4a, 4b can thus consist of one or more metal layer(s) deposited on a contact layer 2a, 2b. Of course, the connection between the two contact layers 2a, 2b and the exterior may alternatively be carried out by any other known means making it possible to electrically connect the layers 2a, 2b.

The capacitor 10, according to the present disclosure, is part of the category of fixed-capacitance non-polarized capacitors. It is understood here that the capacitance remains constant (that is to say with less than 10% variation, or even less than 1% variation) whatever the voltage applied to these armatures (contact layers 2a, 2b or electrodes 4a, 4b), the voltage being greater than several kV, greater than 1000 V, greater than 2000 V, or even greater. The two contact layers 2a, 2b (potentially with their electrodes 4a, 4b) form the two metal armatures of the capacitor 10, separated by an insulating material (the intermediate layer 3). When a voltage is applied between the two armatures, an electric field is formed in the insulating material (intermediate layer 3).

The capacitor 10 is defined by its capacitance C expressed in farads (F):

$$C=\varepsilon_0 \cdot \varepsilon_r \cdot S/d$$

wherein $\varepsilon_0$ is the dielectric constant of the vacuum, $\varepsilon_r$ is the relative dielectric constant (intermediate layer 3), S is the surface area of the metal armatures, and d is the thickness of the intermediate layer 3.

The value of the capacitance C will therefore depend on:
S, the larger S, the larger C will be,
d, the smaller d, the larger C will be, and
$\varepsilon_r$, the larger $\varepsilon_r$, the larger C will be.

Without this being limiting, the lateral dimensions of the capacitor 10, defining the surface area S of the metal armatures, may be between 10 μm and 10 mm.

In addition to these parameters, the capacitor 10 is limited by the maximum electric field that the intermediate layer 3 can withstand. The wide-bandgap semiconductors are known to have very high maximum electric fields. For example, for SiC, this field is about 3 MV/cm and for diamond, it is 10 MV/cm. This intrinsic property of the intermediate layer 3 makes it possible to push back the limits of the capacitors currently available.

According to a first aspect of the present disclosure, the two contact layers 2a, 2b have a resistivity less than or equal to 1 mohm·cm; the series resistance of the capacitor 10 is then negligible (relative to the other resistances of the circuit in which the capacitor 10 will be incorporated). The capacitor 10 then has a purely capacitive behavior.

According to a second aspect of the present disclosure, the two contact layers 2a, 2b have a resistivity greater than 1 mohm·cm (and, recall, less than 10 kohm·cm). The series resistance of the capacitor 10 becomes significant (relative to the other resistances of the circuit in which the capacitor 10 will be integrated) and can be adjusted to produce an RC damper. The capacitor 10 then defines a capacitance with an integrated resistance and forms an RC damping device.

The embodiments below may apply to one or the other of the aforementioned aspects of the present disclosure.

Figure 1B:
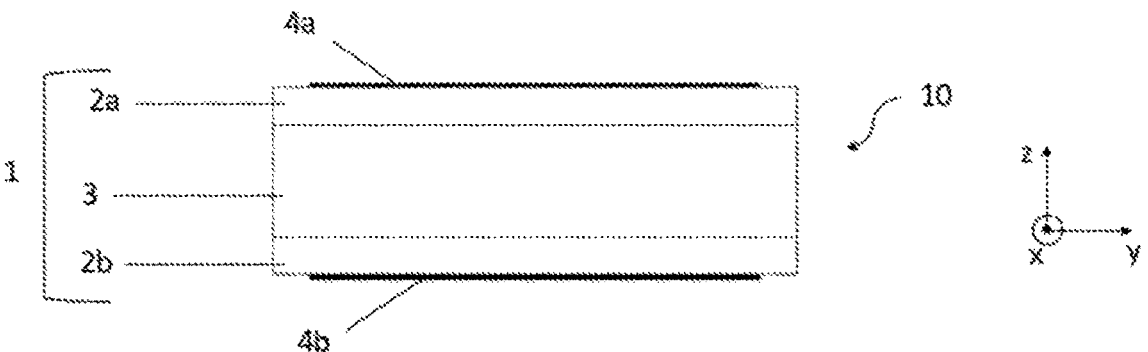

In a first embodiment of the capacitor 10, shown in FIGS. 1A, 1B, each electrode 4a, 4b is arranged on a main face (in the (x, y) plane) of the stack 1 of layers.

Figures 2A, 2B:
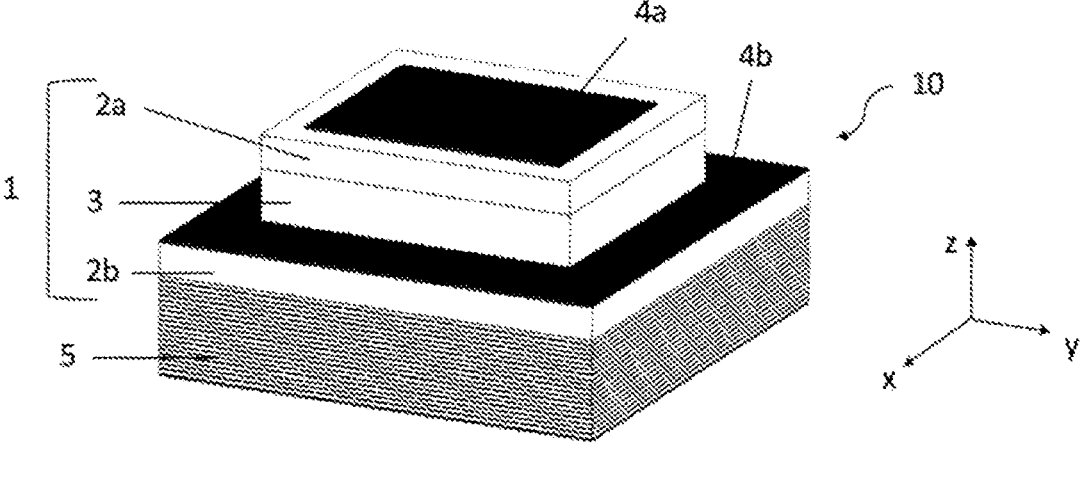
FIGS. 2A and 2B show a second embodiment of a capacitor according to the present disclosure.

According to a second embodiment, shown in FIGS. 2A, 2B, the stack 1 of layers is arranged on a support substrate 5, included in the capacitor 10, which typically forms the support for growth of the layers of the stack 1. The support substrate 5 may be composed of a semiconductor material of the same kind as the semiconductor material of the stack 1 of layers or of a different kind but allowing the growth of the layers of the stack 1.

The presence of this support substrate 5 modifies the arrangement of the electrodes 4a, 4b. An electrode 4a is arranged on the free main face of the upper contact layer 2a. The lower contact layer 2b has a surface in the plane (x, y) larger than the surface, in this same plane, of the other layers of the stack 1 (namely the intermediate layer 3 and the upper contact layer 2a). Thus, the other electrode 4b can be in contact with the lower contact layer 2b at its peripheral surface, free from the other layers of the stack 1 (FIGS. 2A, 2B).

Examples of manufacturing methods for the first and second embodiments will now be described. Diamond is chosen here as semiconductor material.

First Embodiment

The starting point is a diamond wafer of type Ib, enriched with nitrogen (N), obtained by a high-pressure high-temperature (HPHT) technique or chemical vapor deposition (CVD). This wafer has a concentration of deep donors N of $1\times10^{19}/cm^3$ and has the expected insulating properties (resistivity greater than 10 kohm·cm).

Adjusted to the desired thickness, for example, by polishing or laser cutting, this wafer will form the intermediate layer 3.

The choice of the thickness of the intermediate layer 3, for example, 50 μm, determines the value of the capacitance.

The intermediate layer 3 is then treated in a conventional cleaning acid bath, so as to remove the contaminants such as graphites, metals, organic and inorganic materials. A deposition (growth) of a very conductive monocrystalline diamond layer (of p++ type) is carried out on either side of the intermediate layer 3, to form the two contact layers 2a, 2b. The deposition can be carried out, for example, by hot filament (HF) or by microwave plasma (MP) CVD. The boron atom B concentration is $5\times10^{20}$ atm/cm$^3$. The thickness is, for example, 200 nm.

The next step consists of the metallization of the surfaces of the contact layers 2a, 2b. For this, a deposit of metal, titanium (Ti) followed by gold (Au), is, for example, done on the free surfaces of the two contact layers 2a, 2b, with a total thickness of 70 nm (30 nm Ti and 40 nm Au). Other metals may, of course, be used, which will form an ohmic contact. An annealing of the structure is then carried out to promote the formation of a carbide, and confer the ohmic nature to the contact. The annealing can be carried out using a single furnace or an RTA system for rapid and controlled temperature increases, for example, at 450° C. for 1 hour under vacuum with an argon-type inert gas flow.

A capacitor structure 10, according to the first embodiment of the present disclosure, is then obtained (FIGS. 1A, 1B), compatible with a very high voltage, typically up to several kV, and with a capacitance of order 1 pF/mm². The contact layers 2a, 2b here have a resistivity less than 1 mohm·cm, giving a purely capacitive nature to the capacitor 10 (first aspect of the present disclosure).

Second Embodiment

The starting support substrate 5, made of monocrystalline diamond, of any known type, is obtained by a high-pressure high-temperature (HPHT) technique or chemical vapor deposition (CVD). A conventional acid bath cleaning is applied to the support substrate 5 so as to remove the contaminants.

The growth of a very conductive monocrystalline diamond layer (of p++ type) is done on the support substrate 5, to form the lower contact layer 2b of the stack 1. The deposition can be carried out, for example, by hot filament (HF) or by microwave plasma (MP) CVD. The boron atom B concentration is $5\times10^{20}$ atm/cm$^3$. The thickness is 200 nm. The deposition (growth) of a monocrystalline diamond layer, electrically insulating and of n-type (deep nitrogen dopants), is then done to form the intermediate layer 3. The concentration of deep donors is $1\times10^{19}$ atm/cm$^3$ and the thickness of the intermediate layer 3 is about 1 μm. Finally, a new growth of a very conductive monocrystalline diamond layer (of p++ type) is carried out on the intermediate layer 3, to form the upper contact layer 2a of the stack 1, identical to the lower contact layer 2b.

A mask, for example, made of aluminum, is then deposited on the upper contact layer 2a, to delimit a smaller surface than the desired surface for the lower contact layer 2b. It is then possible to etch the unmasked portion of the upper contact layer 2a and of the intermediate layer 3, until the lower contact layer 2b is reached.

After removing the mask, it is possible to carry out the metallization of the free surfaces of the contact layers 2a, 2b, for example, in two successive steps, using masks and/or by implementing lithography techniques. Titanium (Ti) and gold (Au) deposits, or other metals may be produced to form an ohmic contact between each contact layer 2a, 2b and its electrode 4a, 4b. Each electrode 4a, 4b has a thickness of 70 nm. An annealing of the structure, for example, such as that described in the first embodiment, is then carried out to promote the formation of a carbide, and confer the ohmic nature to the contact.

According to a variant of the second embodiment, after the growth of the lower contact layer 2b, a metal mask is deposited on the surface of the lower contact layer 2b, which must remain free of the other layers of the stack 1. Then, the intermediate layer 3 and the upper contact layer 2a are produced, by selective growth, only on a defined surface (the central surface in FIGS. 2A, 2B). The removal of the mask and the metallization can then take place as described above.

Whatever the variant used, a capacitor structure 10, according to the second embodiment of the present disclosure, is then obtained, compatible with a very high voltage, typically up to 1000 V, with a fixed capacitance of order 0.05 nF/mm², regardless of the voltage applied to its terminals. The contact layers 2a, 2b here have a resistivity less than 1 mohm·cm, giving a purely capacitive nature to the capacitor 10 (first aspect of the present disclosure).

According to the second aspect of the present disclosure, in which the capacitor 10 forms an RC damping device, the contact layers 2a, 2b will be made with a thickness of about 1 μm and a resistivity of 1 kohm·cm (typically corresponding to a boron dopant concentration of order 5×10¹⁴/cm³). It is thus possible to obtain a time constant of the RC damping circuit of 1 ns, with the same capacitance as mentioned above, of order 0.05 nF/mm².

Note that the second embodiment provides greater flexibility with the capacitance value, since the thickness of the intermediate layer 3 (insulating) can be manufactured and adjusted with greater ease than in the first embodiment.

The capacitor 10, according to the present disclosure, is capable of storing high energies, typically a voltage greater than 1000 V, greater than 3000 V, or even greater than 5000 V. It provides great stability of capacitance values with temperature, in a temperature range extended between −30° C. and 300° C. The temperature generated leakage currents are negligible.

The capacitor 10 is produced by microelectronic methods; it is, therefore, easy to co-integrate monolithically with active components, on the same chip.

The capacitor according to the present disclosure constitutes a passive component that could be integrated into all electrical power converters used, for example, in hybrid and/or electric cars, aeronautics, energy management, etc. Integrated into bus bars and damping RC networks, it makes it possible to protect the electrical circuits from the failure of a component due to a voltage spike, typically greater than 2000 V, generated during switching between a closed and open circuit.

In general, the capacitor according to the present disclosure can be used to protect a high-voltage electrical circuit against voltage transients.

Of course, the present disclosure is not limited to the embodiments and examples described, and implementation variants may be applied thereto without departing from the scope of the invention as defined by the claims.

The invention claimed is:

1. A capacitor comprising a stack of layers of a semiconductor material having a bandgap energy greater than 2.3 eV, the stack of layers comprising:
   an electrically insulating intermediate layer having a resistivity greater than 10 kohm·cm and comprising n- or p-type deep dopants producing energy levels located at over 0.4 eV from a conduction band or a valence band of the semiconductor, material; and
   two contact layers having a resistivity less than 10 kohm·cm and comprising dopants of opposite type than that of the deep dopants of the intermediate layer, the two contact layers, electrically isolated from each other, being arranged on either side of the intermediate layer to form two pn junctions.

2. The capacitor of claim 1, wherein the two contact layers have a resistivity greater than 1 mohm·cm.

3. The capacitor of claim 2, wherein the capacitor defines a capacitance with an integrated resistor to form an RC damper.

4. The capacitor of claim 2, wherein the deep dopants are present in the intermediate layer in a concentration between 1×10¹⁴/cm³ and 1×10²¹/cm³.

5. The capacitor of claim 4, wherein:
   the intermediate layer has a thickness of between 10 nm and 2 mm; and
   each contact layer has a thickness of between 5 nm and 50 microns.

6. The capacitor of claim 5, wherein the semiconductor material of the stack of layers is chosen from among silicon carbide (SiC), gallium nitride (GaN), aluminum nitride (AlN), ternary or quaternary alloys based on nitride, boron nitride (BN), gallium oxide (Ga₂O₃) or diamond.

7. The capacitor of claim 1, wherein the two contact layers have a resistivity less than or equal to 1 mohm·cm.

8. The capacitor of claim 7, wherein the capacitor is purely capacitive in nature.

9. The capacitor of claim 7, wherein the deep dopants are present in the intermediate layer in a concentration between 1×10¹⁴/cm³ and 1×10²¹/cm³.

10. The capacitor of claim 9, wherein:
   the intermediate layer has a thickness of between 10 nm and 2 mm; and
   each contact layer has a thickness of between 5 nm and 50 microns.

11. The capacitor of claim 10, wherein the semiconductor material of the stack of layers is chosen from among silicon carbide (SiC), gallium nitride (GaN), aluminum nitride (AlN), ternary or quaternary alloys based on nitride, boron nitride (BN), gallium oxide (Ga₂O₃) or diamond.

12. The capacitor of claim 1, wherein the deep dopants are present in the intermediate layer in a concentration between 1×10¹⁴/cm³ and 1×10²¹/cm³.

13. The capacitor of claim 1, wherein:
   the intermediate layer has a thickness of between 10 nm and 2 mm; and
   each contact layer has a thickness of between 5 nm and 50 microns.

14. The capacitor of claim 13, wherein:
   the intermediate layer has a thickness of between 500 nm and 50 microns; and
   each contact layer has a thickness of between 50 nm and 1 micron.

15. The capacitor of claim 1, wherein the semiconductor material of the stack of layers is chosen from among silicon carbide (SiC), gallium nitride (GaN), aluminum nitride (AlN), ternary or quaternary alloys based on nitride, boron nitride (BN), gallium oxide (Ga₂O₃) or diamond.

16. The capacitor of claim 1, further comprising a support substrate on which the stack of layers is disposed.

17. The capacitor of claim 1, wherein:
   the semiconductor material forming the stack of layers is diamond;
   the deep dopants of the intermediate layer are n-type; and
   the dopants of the two contact layers are p-type and are boron atoms (B).

18. The capacitor of claim 17, wherein the deep dopants are nitrogen atoms (N).

19. The capacitor of claim 1, wherein:
   the semiconductor material forming the stack of layers is silicon carbide (SiC);
   the deep dopants of the intermediate layer are p-type and are vanadium atoms (V); and
   the dopants of the two contact layers are n-type and are nitrogen atoms (N).

*   *   *   *   *